United States Patent
Woo et al.

(10) Patent No.: US 9,642,166 B2
(45) Date of Patent: May 2, 2017

(54) CROSS-CONNECTED CASCODE LOW NOISE AMPLIFIER FOR CARRIER AGGREGATION

(71) Applicant: QUALCOMM Incorporated, San Diego, CA (US)

(72) Inventors: Sang Hyun Woo, San Diego, CA (US); Wingching Vincent Leung, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/644,010

(22) Filed: Mar. 10, 2015

(65) Prior Publication Data

US 2015/0351131 A1 Dec. 3, 2015

Related U.S. Application Data

(60) Provisional application No. 62/004,528, filed on May 29, 2014.

(51) Int. Cl.
*H04B 7/00* (2006.01)
*H04W 74/08* (2009.01)
(Continued)

(52) U.S. Cl.
CPC ........ *H04W 74/0833* (2013.01); *H03F 1/223* (2013.01); *H03F 3/193* (2013.01); *H03F 3/245* (2013.01); *H03F 3/68* (2013.01); *H03F 3/72* (2013.01); *H04B 1/401* (2013.01); *H03F 2200/111* (2013.01); *H03F 2200/294* (2013.01); *H03F 2200/492* (2013.01); *H03F 2200/81* (2013.01); *H03F 2200/87* (2013.01); *H04B 2001/0408* (2013.01)

(58) Field of Classification Search
CPC ...... H04W 74/0833; H04B 1/401; H04B 1/40
USPC ............... 455/509, 103, 126, 127.2, 232.1
See application file for complete search history.

(56) References Cited

U.S. PATENT DOCUMENTS 7,161,429 B2   1/2007   Boreysha et al.
8,031,005 B2  10/2011   Xiong et al.
(Continued)

OTHER PUBLICATIONS

International Search Report and Written Opinion for International Application No. PCT/US2015/030756, ISA/EPO, Date of Mailing Jul. 30, 2015, 14 pages.
(Continued)

*Primary Examiner* — Md Talukder
(74) *Attorney, Agent, or Firm* — Toler Law Group, PC

(57) ABSTRACT

An apparatus includes a first amplifier circuit and a second amplifier circuit. The first amplifier circuit has a first output coupled to a first load circuit in a multi-output mode, and the second amplifier circuit has a second output coupled to a second load circuit in the multi-output mode. The apparatus further includes a first divert circuit and a second divert circuit. The first divert circuit is configured to divert a first portion of a first amplified signal from the first amplifier circuit to the second load circuit in the multi-output mode. The second divert circuit is configured to divert a first portion of a second amplified signal from the second amplifier circuit to the first load circuit in the multi-output mode.

20 Claims, 9 Drawing Sheets

(51) Int. Cl.
*H04B 1/401* (2015.01)
*H03F 1/22* (2006.01)
*H03F 3/193* (2006.01)
*H03F 3/24* (2006.01)
*H03F 3/68* (2006.01)
*H03F 3/72* (2006.01)
*H04B 1/04* (2006.01)

(56) References Cited

U.S. PATENT DOCUMENTS

| | | | | |
|---|---|---|---|---|
| 8,175,566 | B2 | 5/2012 | Tasic et al. | |
| 8,737,935 | B2* | 5/2014 | Afsahi | H03F 1/0222 455/103 |
| 2004/0014435 | A1* | 1/2004 | Woo | H04B 1/406 455/103 |
| 2008/0204148 | A1* | 8/2008 | Kim | H03F 1/223 330/306 |
| 2009/0286495 | A1* | 11/2009 | Martikkala | H03F 3/602 455/115.1 |
| 2010/0311378 | A1* | 12/2010 | Tasic | H03F 3/195 455/296 |
| 2011/0018635 | A1* | 1/2011 | Tasic | H03F 1/223 330/277 |
| 2013/0016632 | A1* | 1/2013 | Mujtaba | H04B 7/0608 370/275 |
| 2013/0288612 | A1* | 10/2013 | Afsahi | H03F 1/0222 455/73 |
| 2013/0316669 | A1* | 11/2013 | Davierwalla | H03G 3/20 455/208 |
| 2014/0113578 | A1* | 4/2014 | Xu | H03F 1/223 455/232.1 |
| 2015/0351131 | A1* | 12/2015 | Woo | H04W 74/0833 455/509 |

OTHER PUBLICATIONS

Mak, P-I., et al., "A 0.46-mm2 4-dB NF Unified Receiver Front-End for Full-Band 16-19 Mobile TV in 65-nm CMOS", IEEE Journal of Solid-State Circuits, vol. 46, No. 9, Sep. 2011, IEEE, Piscataway, NJ, pp. 1970-1984.

* cited by examiner ness figure (NF) when simultaneously operating on multiple carriers as compared to when operating independently on a single carrier due to degradation of input matching and/or noise coupling between different signal paths when simultaneously operating on multiple carriers.
CROSS-CONNECTED CASCODE LOW NOISE AMPLIFIER FOR CARRIER AGGREGATION

I. CROSS-REFERENCE TO RELATED APPLICATIONS

The present application claims priority from U.S. Provisional Patent Application No. 62/004,528, filed May 29, 2014 and entitled "CROSS-CONNECTED CASCODE LOW NOISE AMPLIFIER FOR CARRIER AGGREGATION," the content of which is incorporated by reference in its entirety.

II. FIELD

The present disclosure relates generally to electronics, and more specifically to transmitters and receivers.

III. DESCRIPTION OF RELATED ART

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover information contained in the communication signal. The transceiver also includes circuitry that enables the transmission of a communication signal to a receiver in another transceiver. The transceiver may be able to operate over multiple frequency ranges, typically referred to as frequency bands. Moreover, a single transceiver may be configured to operate using multiple carrier signals that may be in the same frequency band, but that may not overlap in frequency, an arrangement referred to as non-contiguous carriers.

In some instances, a single transmitter or receiver is configured to operate using multiple transmit frequencies and/or multiple receive frequencies. For a receiver to be able to simultaneously receive two or more receive signals, two or more receive paths may be concurrently operated. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate carrier signals in the same communication band. Inter-band carrier aggregation refers to the processing of two separate carrier signals that are in different communication bands.

A receiver architecture may use multiple LNAs to support simultaneous downlink channels. The LNA inputs may be connected together to reduce the number of radio frequency (RF) connections used to interface with a transceiver. The LNAs may operate both stand-alone and simultaneously. Stand-alone operation refers to operating on a single carrier signal at a time; and simultaneous operation refers to operating on two or more carrier signals simultaneously. The outputs of the LNAs are separated to provide isolation between the different downlink channels. The LNAs may exhibit a degraded noise figure (NF) when simultaneously operating on multiple carriers as compared to when operating independently on a single carrier due to degradation of input matching and/or noise coupling between different signal paths when simultaneously operating on multiple carriers.

IV. BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

V. DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may include files that are not executable in nature, such as documents that may need to be opened or other data files that need to be accessed.

The term "content" may include files having executable content, such as: object code, scripts, byte code, markup language files, and patches. In addition, "content" referred to herein, may also include files that are not executable in nature, such as documents that may need to be opened or other data files that need to be accessed.

As used herein, the term "stand-alone operation" refers to an amplifier, such as a low noise amplifier (LNA), operating on a single carrier signal at a time, and the term "simultaneous operation" refers to an amplifier, such as an LNA, operating on two or more carrier signals simultaneously.

Figure 1:
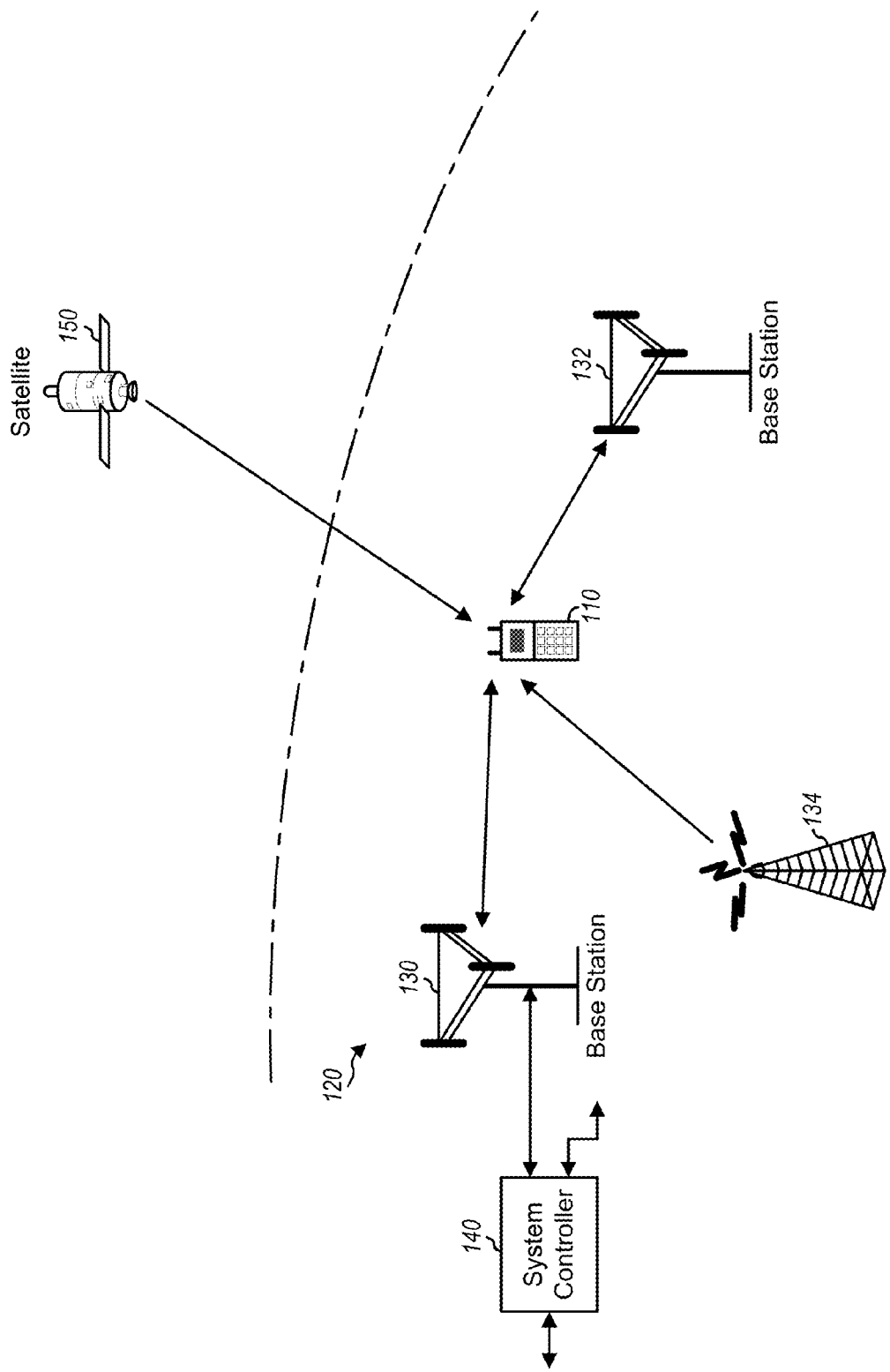
FIG. 1 is a diagram showing a wireless device communicating with a wireless communication system.
Figure 2:
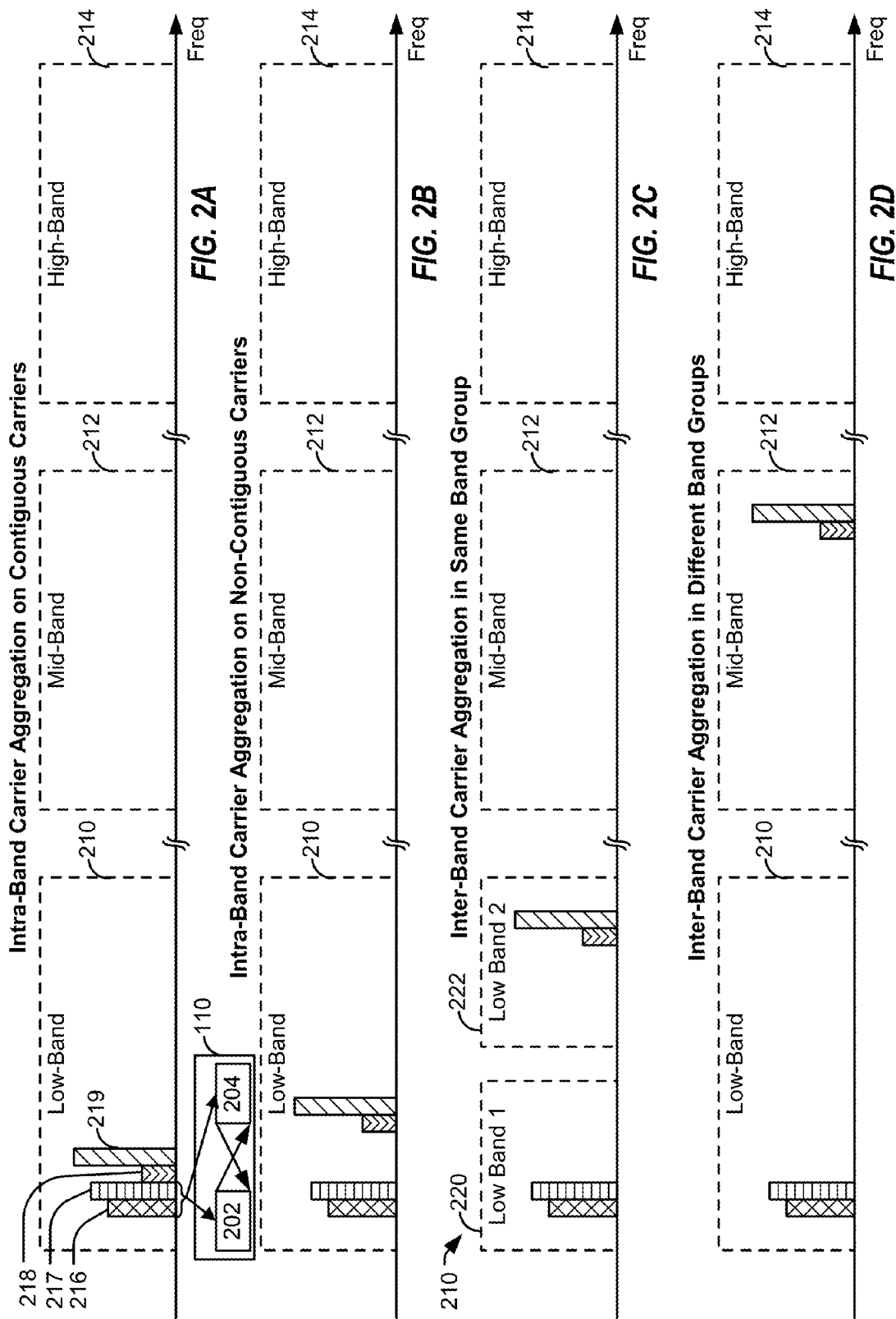
FIG. 2A is a graphical diagram showing an example of contiguous intra-band carrier-aggregation (CA) that may be used by the wireless device of FIG. 1.
FIG. 2B is a graphical diagram showing an example of non-contiguous intra-band CA that may be used by the wireless device of FIG. 1.
FIG. 2C is a graphical diagram showing an example of inter-band CA in the same band group that may be used by the wireless device of FIG. 1.
FIG. 2D is a graphical diagram showing an example of inter-band CA in different band groups that may be used by the wireless device of FIG. 1.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Wireless device 110 may support carrier aggregation, which includes operation on multiple carriers. Carrier aggregation may also be referred to as multi-carrier operation. Wireless device 110 may be able to operate in a low-band (LB) frequency band group (e.g., a "band group" of one or more frequency bands in which a highest frequency included in the one or more frequency bands does not exceed 1000 megahertz (MHz)), a mid-band (MB) frequency band group (e.g., a band group of one or more frequency bands in which a lowest frequency included in the one or more frequency bands exceeds 1000 MHz and in which a highest frequency included in the one or more frequency bands does not exceed 2300 MHz), and/or high-band (HB) frequency band group (e.g., a band group of one or more frequency bands in which a lowest frequency included in the one or more frequency bands exceeds 2300 MHz). For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). In some implementations, each band may have a bandwidth that is less than or equal to 200 MHz and may include one or more carriers. Each carrier may cover up to 20 MHz in LTE. LTE Release 11 supports 35 bands, which are referred to as LTE/UMTS bands and are listed in 3GPP TS 36.101.

Wireless device 110 may include an amplifier having multiple amplification stages that may be cross-coupled in a multi-output mode of the amplifier, such as described further with respect to FIGS. 2-6. In a carrier aggregation mode of operation, the wireless device 110 may amplify different carrier signals at different amplifier stages. In a non-carrier aggregation mode of operation, the wireless device 110 may amplify a carrier signal at multiple amplifier stages that operate in parallel with each other. Because the amplification stages are cross-coupled in the multi-output mode, an input impedance in the multi-output mode may match an input impedance in a single-output mode of the amplifier. The wireless device 110 may therefore support various carrier aggregation modes, such as inter-band and intra-band carrier aggregation, at a single amplifier that uses a single element matching network. As a result, a chip area and cost of the amplifier may be reduced as compared to amplifiers that use more complex matching networks.

In general, carrier aggregation (CA) may be categorized into two types—intra-band CA and inter-band CA. Intra-band CA refers to operation on multiple carriers within the same band. Inter-band CA refers to operation on multiple carriers in different bands.

FIG. 2A is a graphical diagram showing a low-band group 210, a mid-band group 212, a high-band group 214, and an example of contiguous intra-band carrier-aggregation (CA). In the example shown in FIG. 2A, wireless device 110 is configured with four contiguous carriers 216-219 in low-band. Wireless device 110 may send and/or receive transmissions on the four contiguous carriers 216-219 within the same band group. The wireless device 110 may include an LNA that has a first amplification stage 202 and a second amplification stage 204. The first amplification stage 202 may be direct-current (DC) coupled to the second amplification stage 204. The amplification stages 202, 204 may receive an input RF signal that includes a first carrier signal corresponding to the first carrier 216 and a second carrier signal corresponding to the second carrier 217. The first amplification stage 202 is configured to amplify the first carrier signal and the second amplification stage 204 is configured to amplify the second carrier signal. The second amplification stage 204 operates in parallel with the first amplification stage 202. As a result, the wireless device 110 may amplify a first portion of a received signal, the first portion corresponding to the first carrier 216, concurrently with amplifying a second portion of the received signal, the second portion corresponding to the second carrier 217.

FIG. 2B is a graphical diagram showing an example of non-contiguous intra-band CA. In the example shown in FIG. 2B, wireless device 110 is configured to send and/or receive wireless communications using four non-contiguous carriers in one band in the low-band group 210. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured to send and/or receive wireless communications using four carriers in two bands 220, 222 in the low-band group 210. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured to send and/or receive wireless communications using four carriers in two bands in different band groups, which include two carriers in one band in the low-band group 210 and two carriers in another band in the mid-band group 212. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
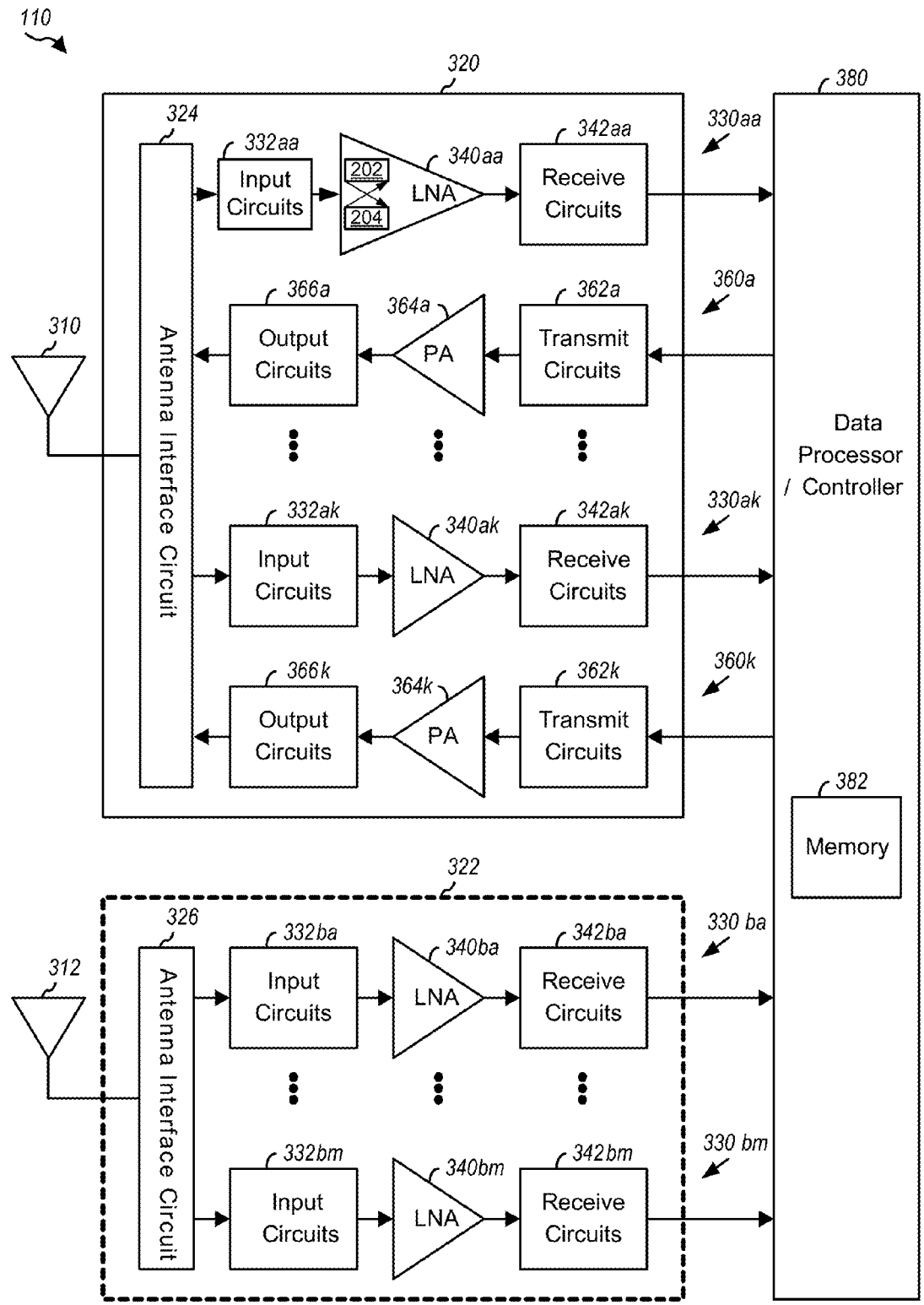
FIG. 3 is a block diagram showing components that may be included in the wireless device of FIG. 1.

FIG. 3 shows a block diagram of an exemplary design of the wireless device 110 in FIG. 1. In this exemplary design, the wireless device 110 includes a transceiver 320 coupled to a primary antenna 310, a transceiver 322 coupled to a secondary antenna 312, and a data processor/controller 380. The transceiver 320 includes multiple (K) receivers 330pa to 330pk and multiple (K) transmitters 350pa to 350pk to support multiple frequency bands, multiple radio technologies, carrier aggregation, etc. The transceiver 322 includes multiple (L) receivers 330sa to 330sl and multiple (L) transmitters 350sa to 350sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 3, each receiver 330pa to 330pk and 330sa to 330sl includes an LNA 340pa to 340pk and 340sa to 340sl and a receive circuit 342pa to 342pk and 342sa to 342sl, respectively. One or more of the LNAs 340pa to 340pk and 340sa to 340sl may include amplification stages configured to be cross-coupled in a multi-output mode of operation. For example, the LNA 340aa may include the first amplification stage 202 and the second amplification stage 204 of FIG. 2.

For data reception, the primary antenna 310 receives signals from base stations and/or other transmitter stations and provides a received RF signal, which is routed through an antenna interface circuit 324 and presented as an input RF signal to a selected receiver (e.g., the receiver 330pk). In a similar manner, the secondary antenna 312 receives signals from base stations and/or other transmitter stations and provides a received RF signal, which is routed through an antenna interface circuit 326 and presented an input RF signal to a selected receiver.

The antenna interface circuit 324 may include switches, duplexers, transmit filters, receive filters, matching circuits, etc. The description below assumes that the receiver 330pk is the selected receiver. Within the receiver 330pk, an LNA 340pk amplifies the input RF signal and provides an output RF signal.

The receive circuits 342pk may downconvert the output RF signal from RF to baseband, amplify and filter the downconverted signal, and provide an analog input signal to the data processor/controller 380. The receive circuits 342pk may include mixers, filters, amplifiers, matching circuits, an oscillator, a local oscillator (LO) generator, a phase locked loop (PLL), etc. Each remaining receiver 330pa, 330sa, 330sl in the transceivers 320, 322 may operate in similar manner as the receiver 330pk.

In the exemplary design shown in FIG. 3, each transmitter 350pa to 350pk and 350sa to 350sl includes a transmit circuit 352pa to 352pk and 352sa to 352sl and a power amplifier (PA) 354pa to 354pk and 354sa to 354sl, respectively. For data transmission, the data processor/controller 380 processes (e.g., encodes and modulates) data to be transmitted and provides an analog output signal to a selected transmitter. The description below assumes that the transmitter 350pa is the selected transmitter. Within transmitter 350pa, the transmit circuits 352pa amplify, filter, and upconvert the analog output signal from baseband to RF and provide a modulated RF signal. The transmit circuits 352pa may include amplifiers, filters, mixers, matching circuits, an oscillator, an LO generator, a PLL, etc. A PA 354pa receives and amplifies the modulated RF signal and provides a transmit RF signal having the proper output power level. The transmit RF signal is routed through the antenna interface circuit 324 and transmitted via the primary antenna 310.

Each remaining transmitter 350pk, 350sa, 35sl in the transceivers 320, 322 may operate in similar manner as the transmitter 350pa.

FIG. 3 shows an exemplary design of receivers 330pa to 330pk and 330sa to 330sl and transmitters 350pa to 350pk and 350sa to 350sl. A receiver and a transmitter may also include other circuits not shown in FIG. 3, such as filters, matching circuits, etc. All or a portion of the transceivers 320 and 322 may be implemented on one or more analog integrated circuits (ICs), RF ICs (RFICs), mixed-signal ICs, etc. For example, LNAs 340pa to 340pk and 340sa to 340sl and receive circuits 342pa to 342pk and 342sa to 342sl may be implemented on one module, which may be an RFIC, etc. The circuits in the transceivers 320 and 322 may also be implemented in other manners.

The data processor/controller 380 may perform various functions for wireless device 110. For example, the data processor/controller 380 may perform processing for data being received via the receivers 330pa to 330pk and 330sa to 330sl and data being transmitted via the transmitters 350pa to 350pk and 350sa to 350sl. The data processor/controller 380 may control the operation of the various circuits within transceivers 320 and 322. A memory 382 may store program codes and data for data processor/controller 380. Data processor/controller 380 may be implemented on one or more application specific integrated circuits (ASICs) and/or other ICs.

Figure 4:
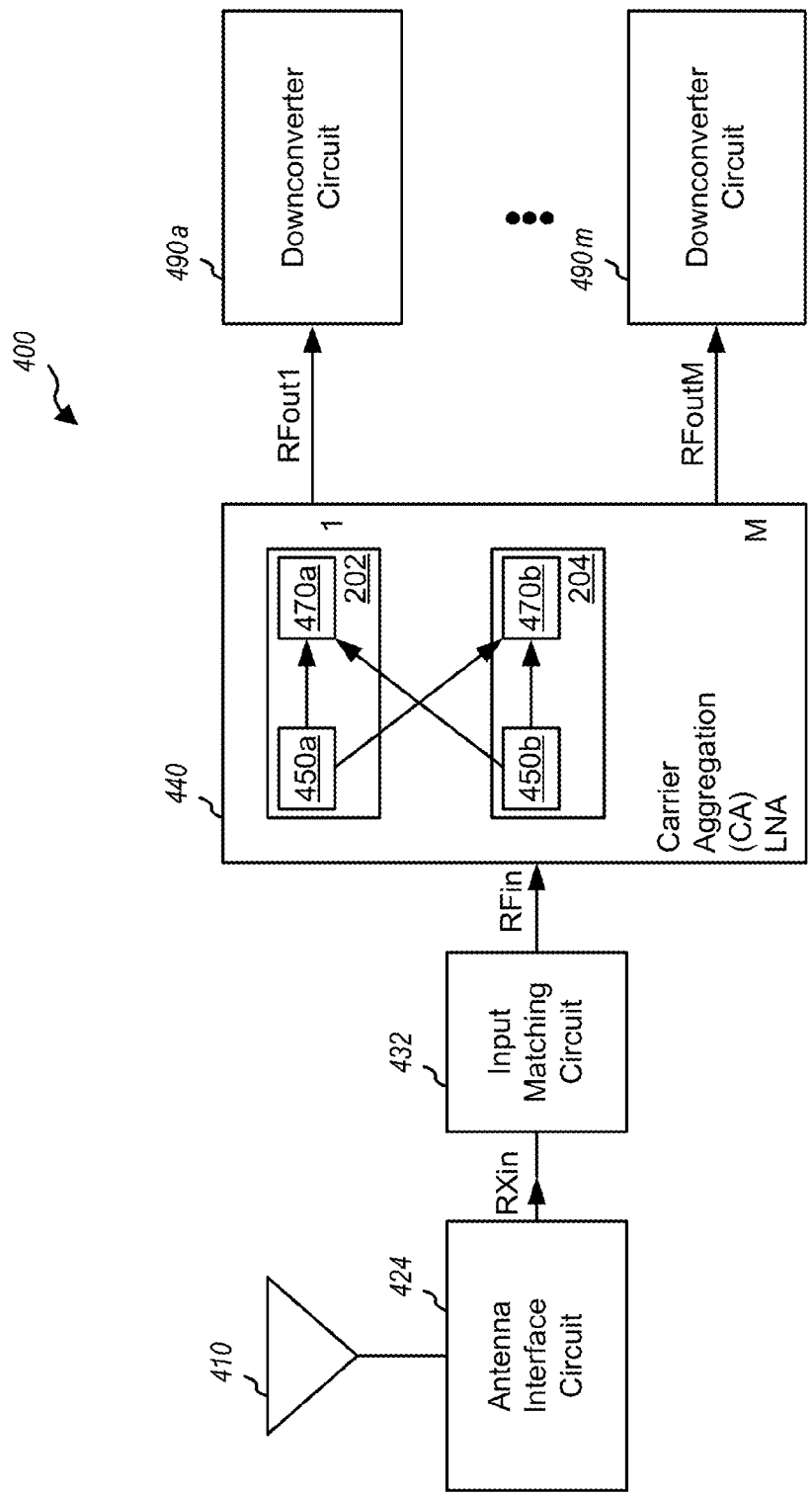
FIG. 4 illustrates an exemplary embodiment of an LNA in a receiver that may be included in the wireless device of FIG. 1.

FIG. 4 shows a block diagram of an exemplary design of a receiver 400 with a CA LNA 440 supporting both an intra-band CA mode and single-output (i.e., no CA) modes. CA LNA 440 may be used for one or more LNAs 340 in FIG. 3. CA LNA 440 includes a single input and multiple (M) outputs, where M>1.

At receiver 400, an antenna 410 receives downlink signals comprising one or more transmissions sent on one or more carriers and provides a received RF signal to an antenna interface circuit 424. Antenna interface circuit 424 filters and routes the received RF signal and provides a receiver input signal, RXin. An input matching circuit 432 receives the RXin signal and provides an input RF signal, RFin, to CA LNA 440. Input matching circuit 432 performs impedance and/or power matching between CA LNA 440 and either antenna interface circuit 424 or antenna 410 for a band of interest. Input matching circuit 432 may be part of one of the input circuits 332 in FIG. 3.

CA LNA 440 receives and amplifies the input RF signal and provides (i) one output RF signal via one LNA output for either no CA or CA on one set of carriers or (ii) up to M output RF signals, RFout1 to RFoutM, via up to M LNA outputs for intra-band CA on up to M sets of carriers. M downconverter circuits 490a to 490m are coupled to the M LNA outputs. Each downconverter circuit 490, when enabled, downconverts an associated output RF signal such that one or more transmissions on one or more carriers of interest are downconverted from RF to baseband.

CA LNA 440 may be configured by a mode-selection signal (not shown) to operate in a single-output mode or a multi-output mode. In the single-output mode, CA LNA 440 operates in a 1-input by 1-output (1×1) configuration. That is, CA LNA 440 receives one input RF signal comprising one or more transmissions on one set of carriers and provides one output RF signal to one downconverter circuit 490. The single-output mode may be used to receive a transmission sent on a single carrier without CA. The single-output mode may also be used to receive transmissions sent on multiple carriers (e.g., contiguous carriers) with CA. In this case, the transmissions on all carriers may be downconverted with a single LO signal at a single frequency. In the multi-output mode, CA LNA 440 operates in a 1×M configuration, in which it receives one input RF signal comprising multiple transmissions on M sets of carriers and provides M output RF signals to M downconverter circuits, where there is one output RF signal for each set of carriers, where M>1. Each set of carriers may include one or more carriers in one band.

The CA LNA 440 may include multiple amplifier stages. For example, CA LNA 440 may include the first amplification stage 202 and the second amplification stage 204 of FIGS. 2 and 3. Each amplification stage of the CA LNA 440 may include an amplifier circuit and a load. For example, the first amplification stage 202 may include a first amplification circuit 450a and a first load 470a, and the second amplification stage 204 may include a second amplification circuit 450b and a second load 470b.

Figure 5:
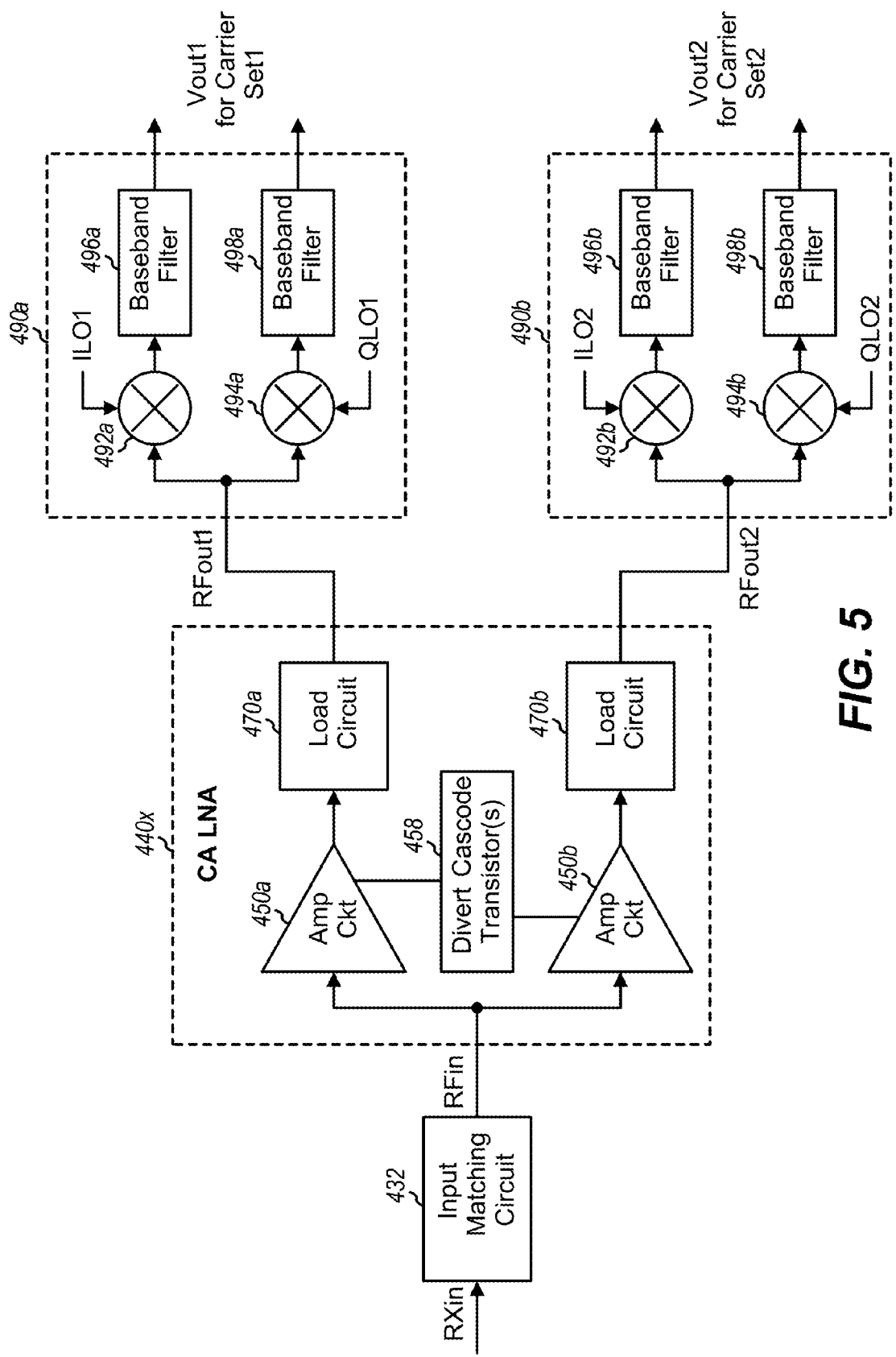
FIG. 5 illustrates another exemplary embodiment of an LNA in a receiver that may be included in the wireless device of FIG. 1.

FIG. 5 shows a block diagram of an exemplary design of CA LNA 440x supporting no CA and intra-band CA on up to two sets of carriers in one band. CA LNA 440x is one exemplary design of CA LNA 440 in FIG. 4.

Figure 6:
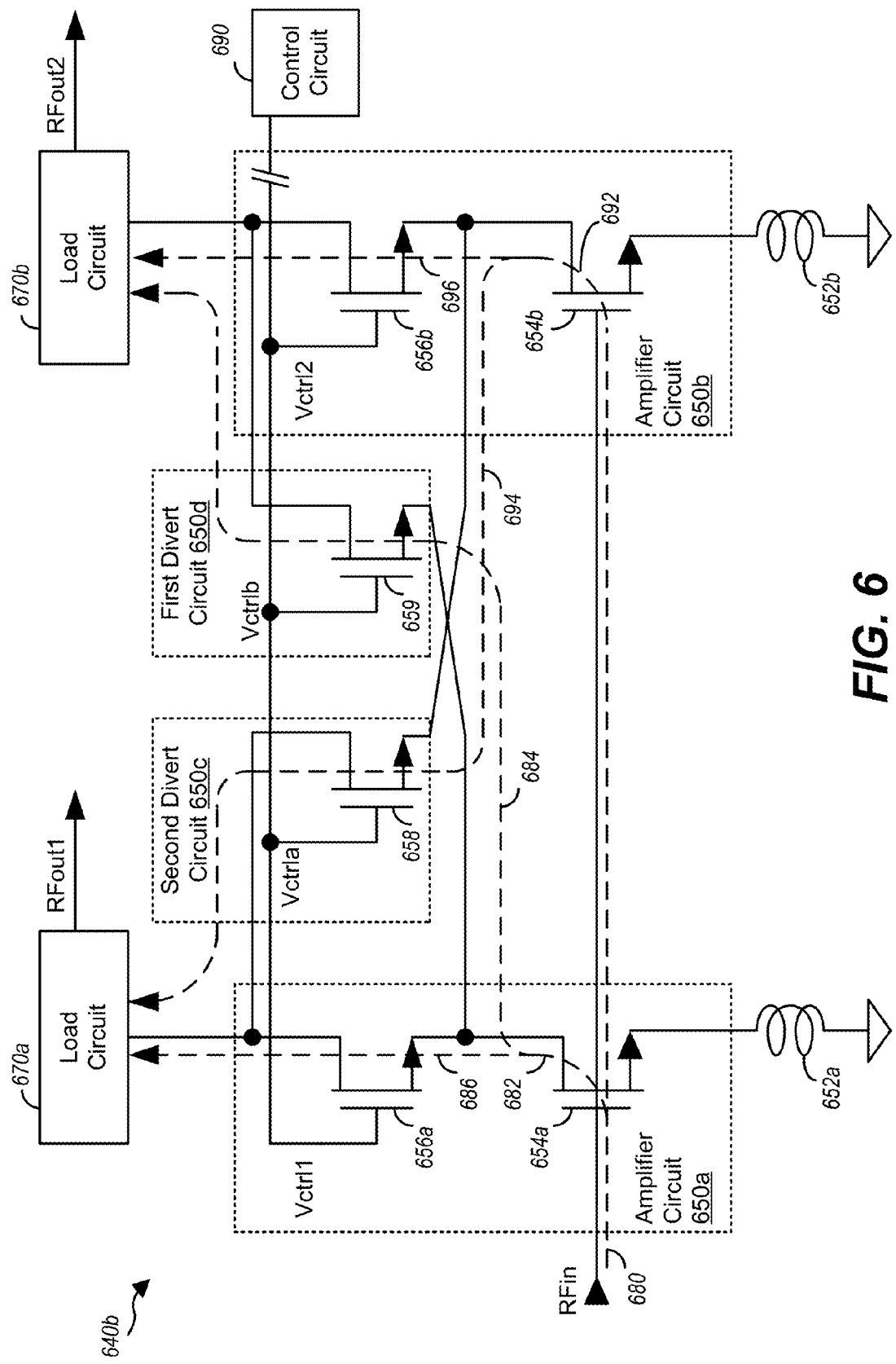
FIG. 6 illustrates an LNA that may be included in the wireless device of FIG. 1 operating in a multi-output mode.

In the exemplary design shown in FIG. 5, CA LNA 440x includes two amplifier circuits (Amp Ckt) 450a and 450b, one or more divert cascode transistors 458, and two load circuits 470a and 470b for two LNA outputs. An amplifier circuit may also be referred to as an amplifier stage, an input stage, a gain circuit, etc. An input RF signal is provided to both amplifier circuits 450a and 450b. Each amplifier circuit 450 amplifies the input RF signal and provides a corresponding amplified RF signal when the amplifier circuit is enabled. One of divert cascode transistor(s) 458 may be enabled to divert RF current from amplifier circuit 450b to amplifier circuit 450a, or vice versa. Alternatively, RF current may be diverted to a load circuit as illustrated in FIG. 6. Load circuits 470a and 470b receive the amplified RF signals from amplifier circuits 450a and 450b, respectively, and provide output RF signals to downconverter circuits 490a and 490b, respectively.

In the exemplary design shown in FIG. 5, each downconverter circuit 490 includes two mixers 492 and 494 coupled to two baseband filters 496 and 498, respectively. Within downconverter circuit 490a, a mixer 492a receives a first output RF signal, RFout1, from load circuit 470a and an inphase LO signal, ILO1, at a first mixing frequency for a first set of carriers. Mixer 492a downconverts the first output RF signal with the ILO1 signal and provides an inphase (I) downconverted signal. A mixer 494a receives the first output RF signal from load circuit 470a and a quadrature LO signal, QLO1, at the first mixing frequency. Mixer 494a downconverts the first output RF signal with the QLO1 signal and provides a quadrature (Q) downconverted signal. Filters 496a and 498a receive and filter the I and Q downconverted signals from mixers 492a and 494a, respectively, and provide I and Q baseband signals, Vout1, for the first set of carriers.

Downconverters 490a and 490b may be enabled to receive transmissions on either one or two sets of carriers. Each downconverter 490 may receive a respective output RF signal from CA LNA 440x, downconvert its output RF signal with a respective LO signal at a suitable mixing frequency, and provide I and Q baseband signals for one set of carriers. Downconverters 490a and 490b may perform downconversion with different mixing frequencies for two sets of carriers.

FIG. 5 shows one exemplary design of downconverter circuits 490. A downconverter circuit may also include different and/or additional circuits. For example, a downconverter circuit may include an amplifier coupled before the mixers, or between the mixers and the filters, or after the filters.

FIG. 5 shows an exemplary design of CA LNA 440x with two amplifier circuits 450 and two load circuits 470 for two LNA outputs. A CA LNA may also include more than two amplifier circuits and/or more than two load circuits for more than two LNA outputs. A CA LNA may include any number of divert cascode transistors. Each divert cascode transistor may be coupled between two amplifier circuits and may divert RF current between these amplifier circuits.

FIG. 6 illustrates an exemplary CA LNA 640b that may be included in the wireless device of FIG. 1. For example, the CA LNA 640b may correspond to one or more of the LNA 340aa, the LNA 340ak, the LNA 340ba, the LNA 340bm, the CA LNA 440, or the CA LNA 440x.

The CA LNA 640b may include a first amplifier circuit 650a and a second amplifier circuit 650b. For example, the first amplifier circuit 650a may correspond to the first amplification circuit 450a of FIG. 4, and the second amplifier circuit 650b may correspond to the second amplification circuit 450b of FIG. 4.

The CA LNA 640b may further include a first divert circuit 650d, a second divert circuit 650c, a first load circuit 670a, and a second load circuit 670b. For example, the first load circuit 670a may correspond to the first load 470a of FIG. 4, and the second load circuit 670b may correspond to the second load 470b of FIG. 4.

The first amplifier circuit 650a may include a first gain transistor 654a and a first cascode transistor 656a that is coupled to an output of the first gain transistor 654a. The second amplifier circuit 650b may include a second gain transistor 654b and a second cascode transistor 656b that is coupled to an output of the second gain transistor 654b.

The first divert circuit 650d may include a first divert transistor 659 coupled to the output of the first gain transistor 654a. The second divert circuit 650c may include a second divert transistor 658 coupled to the output of the second gain transistor 654b. In an exemplary implementation, each of the first gain transistor 654a, the second gain transistor 654b, the first cascode transistor 656a, the second cascode transistor 656b, the first divert transistor 659, and the second divert transistor 658 has substantially the same width as the others of the first gain transistor 654a, the second gain transistor 654b, the first cascode transistor 656a, the second cascode transistor 656b, the first divert transistor 659, and the second divert transistor 658.

The CA LNA 640b may further include a control circuit 690 that is coupled to a first control input of the first divert circuit 650d and that is also coupled to a second control input of the second divert circuit 650c. In an exemplary multi-output mode of operation of the CA LNA 640b, the control circuit 690 may be configured to activate the first divert circuit 650d and the second divert circuit 650c. FIG. 6 illustrates an exemplary multi-mode of operation.

Alternatively or in addition to the multi-output mode of operation, the control circuit 690 may be configured to operate during a first single-output mode of the CA LNA 640b. During the first single-output mode, the control circuit 690 may be configured to activate the first divert circuit 650d and to deactivate the second divert circuit 650c. The first gain transistor 654a and the second gain transistor 654b may be configured to amplify an input signal 680 (e.g., an RF input signal, "RFin") in the multi-output mode and in the first single-output mode. An exemplary first single-output mode is described further with reference to FIG. 7.

Alternatively or in addition to the multi-output mode of operation and the first single-output mode of operation, the control circuit 690 may be configured to operate during a second single-output mode of the CA LNA 640b. During the second single-output mode, the control circuit 690 may be configured to deactivate the first divert circuit 650d and to activate the second divert circuit 650c. An exemplary second single-output mode is described further with reference to FIG. 8.

The CA LNA 640b may further include a first degeneration circuit 652a coupled to the first amplifier circuit 650a. The CA LNA 640b may further include a second degeneration circuit 652b coupled to the second amplifier circuit 650b.

During operation, the first amplifier circuit 650a may have a first output coupled to the first load circuit 670a in a multi-output mode, and the second amplifier circuit 650b may have a second output coupled to the second load circuit 670b in the multi-output mode. The first divert circuit 650d may be configured to divert a first portion 684 of a first amplified signal 682 from the first amplifier circuit 650a to the second load circuit 670b in the multi-output mode, and the second divert circuit 650c may be configured to divert a first portion 694 of a second amplified signal 692 from the second amplifier circuit 650b to the first load circuit 670a in the multi-output mode.

To illustrate, in the multi-output mode, the first divert circuit 650d and the second divert circuit 650c may be configured to enable signal splitting. For example, in the multi-output mode, the first divert circuit 650d may be configured to split (or enable splitting of) the first amplified signal 682 into the first portion 684 of the first amplified signal 682 and a second portion 686 of the first amplified signal 682. In this example of the multi-output mode, the first portion 684 of the first amplified signal 682 bypasses the first output of the first amplifier circuit 650a, and the second portion 686 of the first amplified signal 682 is provided to the first cascode transistor 656a in the first amplifier circuit 650a. To further illustrate, in the multi-output mode the second divert circuit 650c may be configured to split (or enable splitting of) the second amplified signal 692 into the first portion 694 of the second amplified signal 692 and a second portion 696 of the second amplified signal 692. In the multi-output mode, the first portion 694 of the second amplified signal 692 bypasses the second output of the second amplifier circuit 650b and the second portion 696 of the second amplified signal 692 is provided to the second cascode transistor 656b in the second amplifier circuit 650b.

The control circuit 690 may be configured to control (e.g., activate and deactivate) the first cascode transistor 656a, the first divert transistor 659, the second cascode transistor 656b, and the second divert transistor 658 using control signals Vctrl1, Vctrlb, Vctrl2, and Vctrla, respectively. For example, in the multi-output mode, each of the first cascode transistor 656a, the first divert transistor 659, the second cascode transistor 656b, and the second divert transistor 658 may be activated using a high bias voltage. In the multi-output mode, the first divert transistor 659 may be biased to divert the first portion 684 of the first amplified signal 682, and the second divert transistor 658 may be biased to divert the first portion 694 of the second amplified signal 692.

The first load circuit 670a may be responsive to the second portion 686 of the first amplified signal 682 and to the first portion 694 of the second amplified signal 692. For example, the first load circuit 670a may generate a first output signal (e.g., a first RF output signal, "RFout1") based on the second portion 686 of the first amplified signal 682 and the first portion 694 of the second amplified signal 692. The second load circuit 670b may be responsive to the first portion 684 of the first amplified signal 682 and to the second portion 696 of the second amplified signal 692. For example, the second load circuit 670b may generate a second output signal (e.g., a second RF output signal, "RFout2") based on the first portion 684 of the first amplified signal 682 and the second portion 696 of the second amplified signal 692.

The example of FIG. 6 illustrates that effective width/length (W/L ratios) associated with the first cascode transistor 656a and the second cascode transistor 656b can be controlled using the first divert circuit 650c and the second divert circuit 650d. For example, the first divert circuit 650c and the second divert circuit 650d may divert the first portion 684 of the first amplified signal 682 and the first portion 694 of the second amplified signal 692, which may change an amount of current conducted through the first cascode transistor 656a and the second cascode transistor 656b. Thus, the effective W/L ratios of the first cascode transistor 656a and the second cascode transistor 656b can be controlled.

Figure 7:
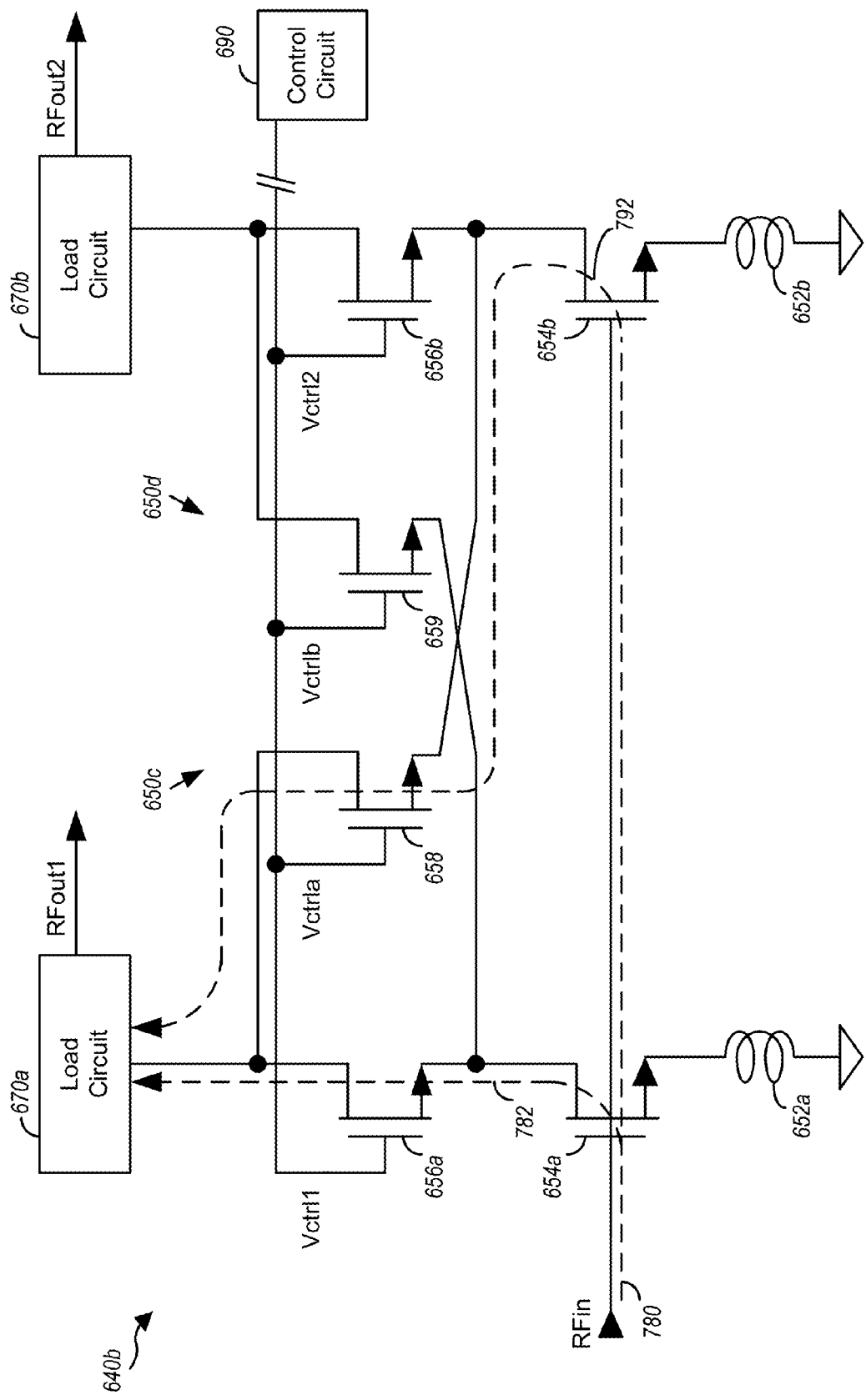
FIG. 7 illustrates the LNA of FIG. 6 operating in a first single-output mode.

FIG. 7 illustrates an exemplary first single-output mode of the CA LNA 640b. During operation in the first single-output mode, the control circuit 690 may activate the first cascode transistor 656a and the second divert transistor 658 using the control signals Vctrl1 and Vctrla, respectively (e.g., using a high bias voltage). The control circuit 690 may deactivate the first divert transistor 659 and the second cascode transistor 656b using the control signals Vctrlb and Vctrl2, respectively (e.g., using a low bias voltage).

The CA LNA 640b may be responsive to an input signal 780. The first gain transistor 654a may be configured to generate a first amplified signal 782 based on the input signal 780, and the second gain transistor 654b may be configured to generate a second amplified signal 792 based on the input signal 780. The first cascode transistor 656a may be configured to provide the first amplified signal 782 to the first load circuit 670a, and the second divert transistor 658 may be configured to provide the second amplified signal 792 to the first load circuit 670a. Thus, in FIG. 7, the first amplified signal 782 and the second amplified signal 792 are diverted to the first load circuit 670a and diverting of the first amplified signal 792 to the second load circuit 670b is disabled.

In an exemplary embodiment, a first input impedance of the first amplifier circuit 650a and the second amplifier circuit 650b in the multi-output mode is substantially the same as a second input impedance of the first amplifier circuit 650a and the second amplifier circuit 650b in the first single-output mode. For example, by diverting currents using the divert circuits 650d, 650d, the first input impedance can be "matched" to the second input impedance (or vice versa).

A first effective cascode device width of the first cascode transistor 656a in the multi-output mode may be substantially the same as a second effective cascode device width of the first cascode transistor 656a in the first single-output mode. For example, by diverting the second amplified signal 792 using the second divert circuit 650c, the second load circuit 670b can be effectively disabled without changing effective cascode device width of the first cascode transistor 656a.

Maintaining effective cascode device width of the first cascode transistor 656a may improve operation of the CA LNA 640b. For example, maintaining effective cascode device width may reduce or eliminate a change of input impedance associated with the first cascode transistor 656*a* during a change of mode of the CA LNA 640*b* (e.g., from the multi-output mode to the first single-output mode).

Figure 8:
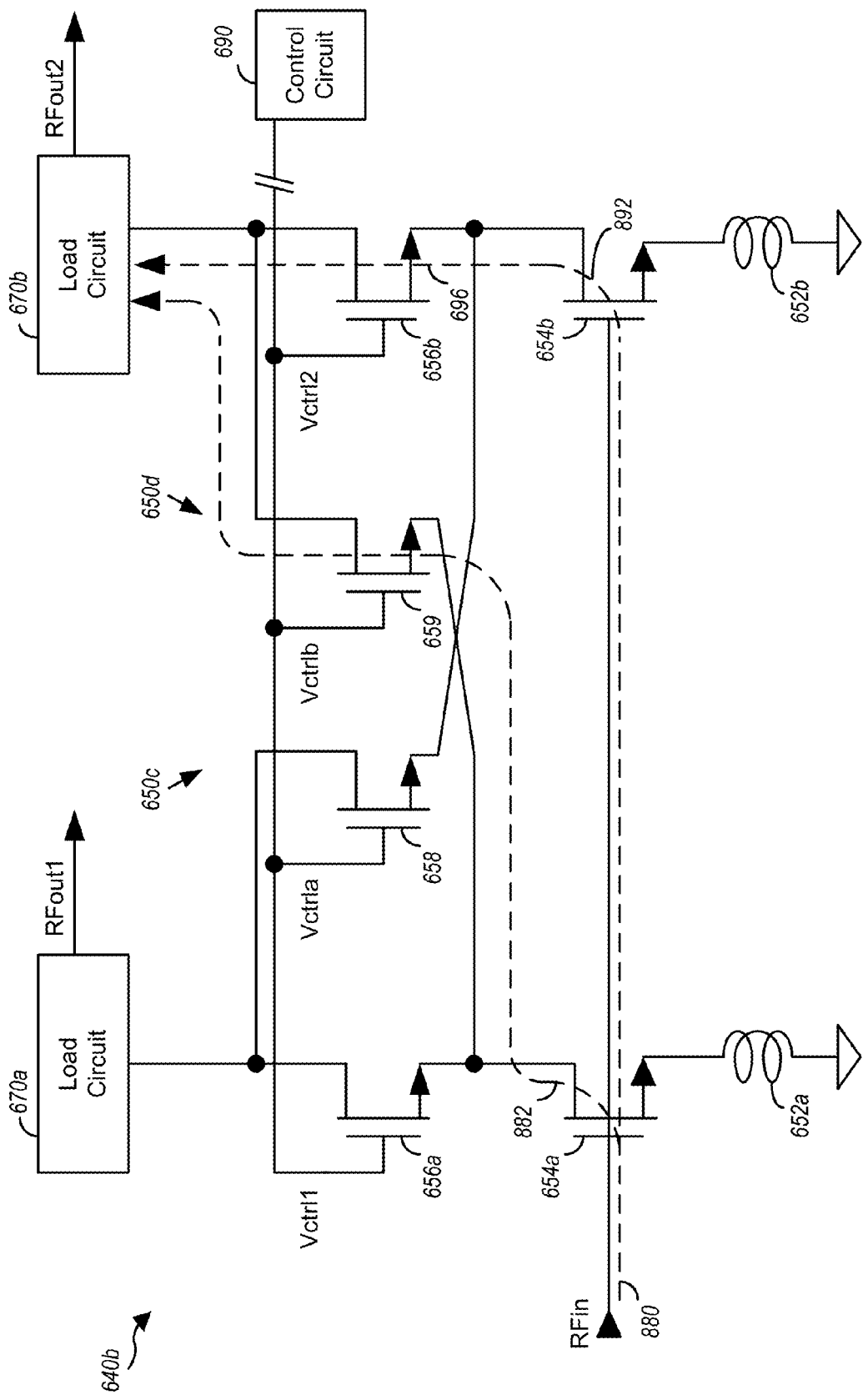
FIG. 8 illustrates the LNA of FIG. 6 operating in a second single-output mode.

FIG. 8 illustrates an exemplary second single-output mode of the CA LNA 640*b*. During operation in the second single-output mode, the control circuit 690 may deactivate the first cascode transistor 656*a* and the second divert transistor 658 using the control signals Vctrl1 and Vctrla, respectively (e.g., using a low bias voltage). The control circuit 690 may activate the first divert transistor 659 and the second cascode transistor 656*b* using the control signals Vctrlb and Vctrl2, respectively (e.g., using a high bias voltage).

The CA LNA 640*b* may be responsive to an input signal 880. The first gain transistor 654*a* may be configured to generate a first amplified signal 882 based on the input signal 880, and the second gain transistor 654*b* may be configured to generate a second amplified signal 892 based on the input signal 880. The first divert transistor 659 may be configured to provide the first amplified signal 882 to the second load circuit 670*b*, and the second cascode transistor 656*b* may be configured to provide the second amplified signal 892 to the second load circuit 670*b*. Thus, in FIG. 8, the first amplified signal 882 and the second amplified signal 892 are diverted to the second load circuit 670*b* and diverting of the first amplified signal 892 to the first load circuit 670*a* is disabled.

A first effective cascode device width of the second cascode transistor 656*b* in the multi-output mode may be substantially the same as a second effective cascode device width of the second cascode transistor 656*b* in the second single-output mode. For example, by diverting the first amplified signal 882 using the first divert circuit 650*d*, the first load circuit 670*a* can be effectively disabled without changing effective cascode device width of the second cascode transistor 656*b*. Maintaining effective cascode device width of the second cascode transistor 656*b* may improve operation of the CA LNA 640*b*, such as by reducing or eliminating a change of input impedance associated with the second cascode transistor 656*b* during a change of mode of the CA LNA 640*b* (e.g., from the multi-output mode to the second single-output mode).

Figure 9:
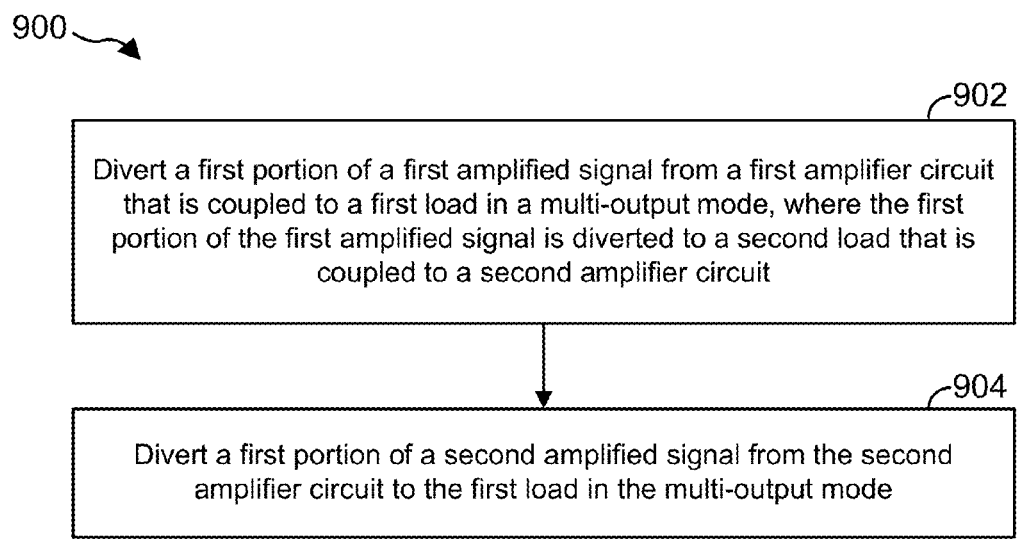
FIG. 9 illustrates an exemplary embodiment of a method that may be performed in the wireless device of FIG. 1.

Referring to FIG. 9, an exemplary embodiment of a method is depicted and generally designated 900. The method 900 may be performed in a wireless device that includes an amplifier with multiple amplification stages, such as the wireless device 110 of FIG. 1 that includes the CA LNA 640*b* of FIG. 6. For example, the method 900 may be performed by the CA LNA 640*b* of FIG. 6.

A first portion of a first amplified signal (e.g., the first portion 684 of the first amplified signal 682) is diverted from a first amplifier circuit (e.g., the first amplifier circuit 650*a*) that is coupled to a first load (e.g., the first load circuit 670*a*) in a multi-output mode, at 902. The first portion of the first amplified signal is diverted to a second load (e.g., the second load circuit 670*b*) that is coupled to a second amplifier circuit (e.g., the second amplifier circuit 650*b*).

A first portion of a second amplified signal (e.g., the first portion 694 of the second amplified signal 692) is diverted from the second amplifier circuit to the first load in the multi-output mode, at 904.

The method 900 may also include disabling diverting of the first portion of the first amplified signal to the second load to transition from the multi-output mode to a first single-output mode. For example, FIG. 7 illustrates an exemplary first single-output mode in which the first amplified signal 782 and the second amplified signal 792 are provided to the first load circuit 670*a* and in which diverting to the second load circuit 670*b* is disabled.

The method 900 may also include disabling diverting of the first portion of the second amplified signal to the first load to transition from the multi-output mode to a second single-output mode. For example, FIG. 8 illustrates an exemplary second single-output mode in which the first amplified signal 882 and the second amplified signal 892 are provided to the second load circuit 670*b* and in which diverting to the first load circuit 670*a* is disabled.

The method 900 enables operation of multiple amplification stages in connection with a non-carrier (NC) aggregation mode. In addition to an NC aggregation mode, various carrier aggregation modes, such as inter-band and intra-band carrier aggregation, may also be supported using a single amplifier that uses a single element matching network. As a result, a chip area and cost of the amplifier may be reduced as compared to amplifiers that use more complex matching networks.

Although FIG. 9 depicts a particular order of elements of the method 900, it should be understood that, in other embodiments, elements of the method 900 may be performed in another order. In addition, two or more (or all) of the elements of the method 900 may be performed simultaneously or substantially simultaneously. For example, the input signal may be provided to the first amplification stage (at 902) simultaneously with (or substantially simultaneously with) being provided to the second amplification stage (at 904). As another example, the first gain control signal and the second gain control signal may be applied to the respective gain control circuitry at substantially the same time.

In conjunction with the disclosed embodiments, an apparatus is described that includes first means for amplifying (e.g., the first amplifier circuit 650*a*) coupled to a first load (e.g., the first load circuit 670*a*) in a multi-output mode. The apparatus further includes second means for amplifying (e.g., the second amplifier circuit 650*b*) coupled to a second load (e.g., the second load circuit 670*b*) in the multi-output mode.

The apparatus further includes first means for diverting (e.g., the first divert circuit 650*d*) a first portion of a first amplified signal (e.g., the first portion 684 of the first amplified signal 682) from the first means for amplifying to the second load in the multi-output mode. The apparatus further includes second means for diverting (e.g., the second divert circuit 650*c*) a first portion of a second amplified signal (e.g., the first portion 694 of the second amplified signal 692) from the second means for amplifying to the first load in the multi-output mode.

In the multi-output mode, the first means for diverting and the second means for diverting may perform signal splitting. For example, the first divert circuit 650*d* may split the first amplified signal 682, and the second divert circuit 650*c* may split the second amplified signal 692. The apparatus may also include means (e.g., the control circuit 690) for activating the first means for diverting and activating the second means for diverting in the multi-output mode and for activating the first means for diverting and deactivating the second means for diverting in a first single-output mode.

One or more devices described herein (e.g., the CA LNA 440, the CA LNA 440*x*, the CA LNA 640*b*, or a combination thereof) may be implemented on one or more ICs, analog ICs, RFICs, mixed-signal ICs, ASICs, printed circuit boards (PCBs), electronic devices, etc. A device may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. In an exemplary embodiment, a storage device stores data in a form that is not a transient or propagating signal, such as based on an optical reflectivity or magnetic orientation of a physical storage material, an amount of charge stored on a floating gate of a transistor or on a plate of a capacitor, etc. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. To illustrate, the data processor 380 of FIG. 3 may execute program instructions to select values of control signals, such as the control signals Vctrl1, Vctrla, Vctrlb, and Vctrl2 of FIGS. 6-8. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon.

Although selected aspects have been illustrated and described in detail, it will be understood that various substitutions and alterations may be made therein without departing from the spirit and scope of the present invention, as defined by the following claims.

What is claimed is:

1. An apparatus comprising:
a first amplifier circuit having a first output coupled to a first load circuit, wherein the first amplifier circuit is coupled to a first degeneration circuit;
a second amplifier circuit having a second output coupled to a second load circuit, wherein the second amplifier circuit is coupled to a second degeneration circuit;
a first divert circuit configured, in a multi-output mode, to divert a first portion of a first amplified signal from the first amplifier circuit to the second load circuit;
a second divert circuit configured, in the multi-output mode, to divert a first portion of a second amplified signal from the second amplifier circuit to the first load circuit; and
a control circuit configured to provide, in the multi-output mode, a first control signal to a first cascode transistor of the first amplifier, a second control signal to the first divert circuit, a third control signal to the second divert circuit, and a fourth control signal to a second cascode transistor of the second amplifier, wherein the first cascode transistor is configured to be enabled by the first control signal, the first divert circuit is configured to be enabled by the second control signal, the second divert circuit is configured to be enabled by the third control signal, and the second cascode transistor is configured to be enabled by the fourth control signal.

2. The apparatus of claim 1, wherein in the multi-output mode, the first divert circuit is configured to split the first amplified signal into the first portion of the first amplified signal and a second portion of the first amplified signal.

3. The apparatus of claim 2, wherein in the multi-output mode, the first portion of the first amplified signal bypasses the first output and the second portion of the first amplified signal is provided to a first cascode transistor in the first amplifier circuit.

4. The apparatus of claim 2, wherein in the multi-output mode, the second divert circuit is configured to split the second amplified signal into the first portion of the second amplified signal and a second portion of the second amplified signal, and wherein in the multi-output mode, the first portion of the second amplified signal bypasses the second output and the second portion of the second amplified signal is provided to a second cascode transistor in the second amplifier circuit.

5. The apparatus of claim 1, wherein the first amplifier circuit comprises a first gain transistor and the first cascode transistor coupled to an output of the first gain transistor, wherein the second amplifier circuit comprises a second gain transistor and the second cascode transistor coupled to an output of the second gain transistor, and wherein in the multi-output mode each of the first amplifier circuit, the second amplifier circuit, the first divert circuit, and the second divert circuit are configured to be enabled.

6. The apparatus of claim 5, wherein the first divert circuit comprises a first divert transistor coupled to the output of the first gain transistor, wherein the second divert circuit comprises a second divert transistor coupled to the output of the second gain transistor.

7. The apparatus of claim 6, wherein in the multi-output mode, the first divert transistor is biased to divert the first portion of the first amplified signal and the second divert transistor is biased to divert the first portion of the second amplified signal.

8. The apparatus of claim 6, wherein each of the first gain transistor, the second gain transistor, the first cascode transistor, the second cascode transistor, the first divert transistor, and the second divert transistor has substantially the same width as the others of the first gain transistor, the second gain transistor, the first cascode transistor, the second cascode transistor, the first divert transistor, and the second divert transistor.

9. The apparatus of claim 1, wherein the first divert circuit is configured to be activated in the multi-output mode and the second divert circuit is configured to be activated in the multi-output mode.

10. The apparatus of claim 9, wherein the first amplifier circuit includes a first gain transistor and the second amplifier circuit includes a second gain transistor, and wherein the first gain transistor and the second gain transistor are configured to amplify an input signal in the multi-output mode and in a first single-output mode.

11. The apparatus of claim 9, wherein a first input impedance of the first amplifier circuit and the second amplifier circuit in the multi-output mode is substantially the same as a second input impedance of the first amplifier circuit and the second amplifier circuit in a first single-output mode, and wherein a first input impedance of a first cascode transistor of the first amplifier circuit in the multi-output mode is substantially the same as a second input impedance of the first cascode transistor of the first amplifier circuit in the first single-output mode.

12. The apparatus of claim 9, wherein the first divert circuit is configured to be activated in a first single-output mode and the second divert circuit is configured to be deactivated in the first single-output mode, and wherein the first divert circuit is configured to be deactivated in a second single-output mode and the second divert circuit is configured to be activated in the second single-output mode.

13. The apparatus of claim 1, wherein the first amplifier circuit is configured to receive a second portion of the first amplified signal in the multi-output mode.

14. The apparatus of claim 1, wherein in the multi-output mode, the first divert circuit is configured to divert the first portion of the first amplified signal from an output of a first gain transistor of the first amplified circuit, and wherein in the multi-output mode, a first cascode transistor of the first amplifier circuit is configured to receive a second portion of the first amplified signal from the output of the first gain transistor.

15. The apparatus of claim 1, wherein the first amplifier circuit comprises a first gain transistor having a first gate width and the first cascode transistor having a second gate width, the first gate width substantially equal to the second gate width.

16. An apparatus comprising:
first means for amplifying coupled to a first load, wherein the first means for amplifying is coupled to first means for enabling source degeneration;
second means for amplifying coupled to a second load, wherein the second means for amplifying is coupled to second means for enabling source degeneration;
first means for diverting, in a multi-output mode, a first portion of a first amplified signal from the first means for amplifying to the second load;
second means for diverting, in the multi-output mode, a first portion of a second amplified signal from the second means for amplifying to the first load; and
means for providing, in the multi-output mode, a first control signal to a first cascode transistor of the first means for amplifying, a second control signal to the first means for diverting, a third control signal to the second means for diverting, and a fourth control signal to a second cascode transistor of the second means for amplifying, wherein the first cascode transistor is configured to be enabled by the first control signal, the first means for diverting is configured to be enabled by the second control signal, the second means for diverting is configured to be enabled by the third control signal, and the second cascode transistor is configured to be enabled by the fourth control signal.

17. The apparatus of claim 16, wherein in the multi-output mode, the first means for diverting is configured to split the first amplified signal into the first portion of the first amplified signal and a second portion of the first amplified signal.

18. The apparatus of claim 17, wherein in the multi-output mode, the second means for diverting is configured to split the second amplified signal into the first portion of the second amplified signal and a second portion of the second amplified signal.

19. A method comprising:
providing, by a control circuit in a multi-output mode, a first control signal to a first cascode transistor of a first amplifier circuit, a second control signal to a first divert circuit, a third control signal to a second divert circuit, and a fourth control signal to a second cascode transistor of a second amplifier circuit, wherein the first cascode transistor is configured to be enabled by the first control signal, the first divert circuit is configured to be enabled by the second control signal, the second divert circuit is configured to be enabled by the third control signal, and the second cascode transistor is configured to be enabled by the fourth control signal;
diverting, in the multi-output mode, a first portion of a first amplified signal from the first amplifier circuit that is coupled to a first load, the first amplifier circuit coupled to a first degeneration circuit, wherein the first portion of the first amplified signal is diverted to a second load that is coupled to the second amplifier circuit; and
diverting, in the multi-output mode, a first portion of a second amplified signal from the second amplifier circuit to the first load, the second amplifier circuit coupled to a second degeneration circuit.

20. The method of claim 19, further comprising disabling diverting of the first portion of the first amplified signal to the second load to transition from the multi-output mode to a first single-output mode.

* * * * *